(12) United States Patent
Rolston et al.

(10) Patent No.: US 7,200,295 B2
(45) Date of Patent: Apr. 3, 2007

(54) OPTICALLY ENABLED HYBRID SEMICONDUCTOR PACKAGE

(75) Inventors: David R. Rolston, Beaconsfield (CA); Tomasz Maj, Montreal (CA); Richard Mainardi, Montreal (CA); Shao-Wei Fu, Montreal West (CA); Gary Moskovitz, Montreal (CA)

(73) Assignee: Reflex Photonics, Inc., Montréal, Québec (CA)

( * ) Notice: Subject to any disclaimer, the term of this patent is extended or adjusted under 35 U.S.C. 154(b) by 237 days.

(21) Appl. No.: 11/005,297

(22) Filed: Dec. 7, 2004

(65) Prior Publication Data

US 2006/0120660 A1 Jun. 8, 2006

(51) Int. Cl.
*G02B 6/12* (2006.01)
*H01L 21/00* (2006.01)

(52) U.S. Cl. ............................ 385/14; 385/15; 385/31; 385/52; 385/88; 385/49; 385/92; 385/129; 438/29; 438/31

(58) Field of Classification Search .................. 385/14, 385/15, 49, 31, 88, 89, 92, 93, 94, 129, 130, 385/131, 132, 52, 29; 438/29, 31
See application file for complete search history.

(56) References Cited

U.S. PATENT DOCUMENTS

| | | | |
|---|---|---|---|
| 4,732,446 A | 3/1988 | Gipson et al. ............. 385/14 X |
| 5,054,870 A | 10/1991 | Losch et al. ................. 385/14 |
| 5,199,087 A | 3/1993 | Frazier et al. ................ 385/14 |
| 5,521,992 A | 5/1996 | Chun et al. .................. 385/14 |
| 5,764,832 A | 6/1998 | Tabuchi ....................... 385/49 |
| 5,960,141 A | 9/1999 | Sasaki et al. ................. 385/88 |
| 6,058,228 A * | 5/2000 | Fasanella et al. ............. 385/17 |
| 6,427,034 B1 | 7/2002 | Meis et al. ................... 385/14 |
| 6,497,518 B1 * | 12/2002 | Deane .......................... 385/92 |
| 6,512,861 B2 | 1/2003 | Chakravorty et al. ......... 385/14 |
| 6,843,606 B2 * | 1/2005 | Deane et al. .................. 385/92 |
| 6,874,950 B2 * | 4/2005 | Colgan et al. ................ 385/88 |
| 2002/0028045 A1 | 3/2002 | Yoshimura et al. ........... 385/50 |
| 2002/0105001 A1 | 8/2002 | Strelchun ..................... 257/81 |
| 2003/0180012 A1 * | 9/2003 | Deane et al. .................. 385/92 |
| 2006/0110110 A1 * | 5/2006 | Yi et al. ........................ 385/93 |
| 2006/0120660 A1 * | 6/2006 | Rolston et al. ............... 385/15 |

FOREIGN PATENT DOCUMENTS

JP 2004 095869 12/2003

OTHER PUBLICATIONS

Rho et al: J. Lightwave technology, vol. 22, No. 9. 2004.

* cited by examiner

*Primary Examiner*—Brian M. Healy
(74) *Attorney, Agent, or Firm*—Ogilvy Renault, LLP

(57) ABSTRACT

The present invention provides a self-contained optical hybrid IC (OHIC) package for optical side-coupling to an optical waveguide of a printed wiring board (PWB). The OHIC package comprises an integrated circuit (IC) package. It also comprises a self-contained optical subassembly (OSA) having an optical coupling facet and being adapted to be bonded to the integrated circuit (IC) package, wherein the OSA comprises an optoelectronic device and an optical channel, the optoelectronic device being optically coupled to the optical channel, the optical channel relaying light between the optoelectronic device and the optical coupling facet, wherein the OSA is mechanically and electrically bonded to the IC package to thereby provide an electrical coupling between the optoelectronic device and the IC package and enable the optical side-coupling to the optical waveguide via the optical coupling facet. The invention also provides a method for creating the OHIC package.

44 Claims, 20 Drawing Sheets

OPTICALLY ENABLED HYBRID SEMICONDUCTOR PACKAGE

RELATED APPLICATION

This application is the first application filed for the present invention. This application is related to commonly assigned co-pending U.S. applications bearing Ser. No. 10/625,901, pending, entitled "Optical Ferrule", Ser. No. 10/725,566, pending, entitled "Encapsulated Optical Package" and Ser. No. 10/625,905, pending, entitled "Optical Connector Assembly", the specifications of which are hereby incorporated by reference.

FIELD OF THE INVENTION

The invention relates to the field of printed circuit boards (PCB) for ultra-high speed applications. In particular, the invention relates to the hybrid integration of optical, optoelectronic and electronic components to standard printed wiring board.

BACKGROUND OF THE ART

One of the major difficulties faced in the integration of optoelectronic packages with printed wiring boards (PWB), is to couple efficiently the light between optoelectronic devices and optical waveguides provided on a PWB.

Several methods have been proposed to perform such integration in the case of optoelectronic packages that comprises a vertical cavity surface emitting laser (VCSEL), but most of them involve at some point the step of aligning a 45 degree mirror with respect to the VCSEL output in order to deflect the VCSEL light into an optical waveguide embedded into a PCB. FIG. 1b shows an example of such prior art embodiment where a VCSEL 13, mounted inside the cavity of a cavity down ball grid array (BGA) 22, is optically coupled to an embedded optical waveguide 18 by means of a 45 degree mirror 25 that was inserted and aligned inside the PWB 20. However, this alignment step is difficult to achieve and is thus time-consuming.

In another proposed method, illustrated in FIG. 1c, the integrated circuit IC package 12 includes a VCSEL 13 inserted into a PWB 20 recessed section for optical coupling to an embedded optical waveguide 18. A butterfly package 36, as shown in FIG. 1a, is another prior art embodiment where an optical fiber 19 was aligned to a laser output and then bonded to the package. Again, these prior art embodiments require an alignment step of the laser 13 with respect to the optical waveguide 18 or optical fiber 19 which remains a time-consuming process.

Recently, it was proposed by Rho et al. (J. Lightwave Technology, vol. 22, no. 9, 2004) to use a 45 degree ended optical connection rod as a medium to guide light emitted by the VCSEL toward an embedded optical waveguide of the PWB. However this method still comprises the step of aligning the rod with respect to the VCSEL and with respect to the embedded waveguide, which can be difficult and time consuming.

SUMMARY

The present invention provides a method and apparatus for the hybrid integration of optoelectronics, optics, optical fibers, waveguides, standard electronic packages and standard printed wiring boards to create optically enabled printed circuit boards (OE-PCBs) for ultra-high speed computing and switching applications.

This invention provides concepts that are directed towards the manufacturability of volume quantities of OE-PCBs. With these concepts, components and sub-components can be quickly and easily integrated with printed wiring boards and optical waveguides in a reliable manner to achieve high-yield, high volume finished parts.

The present invention provides a self-contained optical hybrid IC (OHIC) package for optical side-coupling to an optical waveguide of a printed wiring board (PWB). The OHIC comprises an integrated circuit (IC) package. The OHIC also comprises a self-contained optical subassembly (OSA) having an optical coupling facet and being adapted to be bonded to the integrated circuit (IC) package, wherein the OSA comprises an optoelectronic device and an optical channel, the optoelectronic device being optically coupled to the optical channel, the optical channel relaying light between the optoelectronic device and the optical coupling facet, wherein the OSA is mechanically and electrically bonded to the IC package to thereby provide an electrical coupling between the optoelectronic device and the IC package and enable the optical side-coupling to the optical waveguide via the optical coupling facet.

The invention also provides a method of creating a self-contained optical hybrid IC (OHIC) package for optical side-coupling to an optical waveguide of a printed wiring board (PWB). The method comprises providing an integrated circuit (IC) package. The method comprises providing a self-contained optical subassembly (OSA) having an optical coupling facet and being adapted to be bonded to an integrated circuit (IC) package, wherein the self-contained OSA comprises an optoelectronic device to which is optically coupled an optical channel, the optical channel relaying light between the optoelectronic device and the optical coupling facet. The method comprises electrically bonding the OSA to the IC package to thereby provide an electrical coupling between the optoelectronic device and the IC package and enable the side-coupling to the optical waveguide via the optical coupling facet.

The method further comprises creating an optically enabled printed circuit board (OE-PCB) for the optical side-coupling of the OHIC package to the optical waveguide by providing a portion of a printed wiring board (PWB) adapted to accept the OHIC package, wherein the portion of the PWB comprises the optical waveguide. Also it comprises placing the OHIC package on the portion of the PWB with the optical coupling facet facing an end facet of the optical waveguide and bonding the placed OHIC package to the portion of the PWB for achieving the optical side-coupling and thereby creating said OE-PCB.

The invention also provides an optically enabled printed circuit board (OE-PCB) for optical side-coupling of an integrated circuit (IC) package to an optical waveguide, wherein the IC package incorporates an optoelectronic device. The OE-PCB comprises a self-contained optical hybrid IC (OHIC) package having an optical coupling facet and being adapted to be mounted to a printed wiring board (PWB), wherein the self-contained OHIC package comprises the IC package and an optical channel for relaying light between the optoelectronic device and the optical coupling facet, to thereby enable the optical side coupling. The OE-PCB also comprises a printed wiring board (PWB), adapted to accept the OHIC package, wherein the PWB comprises the optical waveguide, wherein the OHIC package is placed on the PWB and bonded to the PWB such that the optical coupling facet of the OHIC package faces an end of the optical waveguide for achieving the optical side-coupling and thereby creating the OE-PCB.

DESCRIPTION OF THE DRAWINGS

In order that the invention may be readily understood, embodiments of the invention are illustrated by way of example in the accompanying drawings.

FIG. 3b is a schematic bottom view of the OHIC of FIG. 3a;

DETAILED DESCRIPTION

In the following description of the embodiments, reference to the accompanying drawings are by way of illustration of an example by which the invention may be practiced. It will be understood that other embodiments may be made without departing from the scope of the invention disclosed.

In one embodiment of the present invention, an integrated circuit (IC) package is modified to accept an optical sub assembly (OSA) in order to form an optical hybrid IC (OHIC) package, which can then be easily side-coupled to an optical waveguide of a printed circuit board (PWB) to form an optically enabled printed circuit board (OE-PCB).

Integrated Circuit (IC) Packages

Figure 1A:
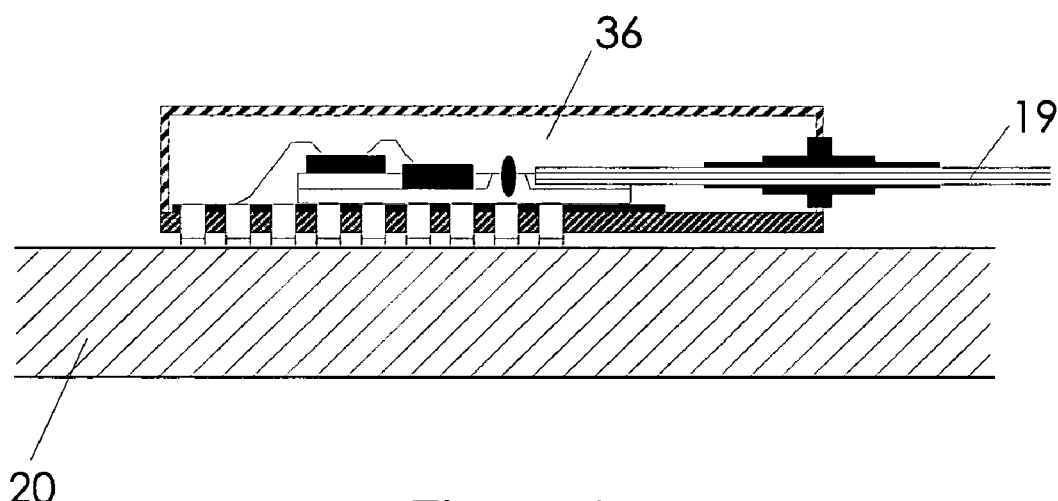
FIGS. 1a to 1c, are schematic representations of several ways, found in the prior art, to optically couple light emitted by a laser into an optical waveguide: a) is a cross-section of an butterfly package and its butt-coupled optical fiber, b) is a cross-section of BGA package in which is installed a VCSEL laser and which is coupled by an external 45 degree mirror to an embedded waveguide, and c) is a cross-section of an integrated circuit (IC) package that includes a VCSEL inserted into a PCB recessed section for coupling with the optical waveguide.
Figure 1B:
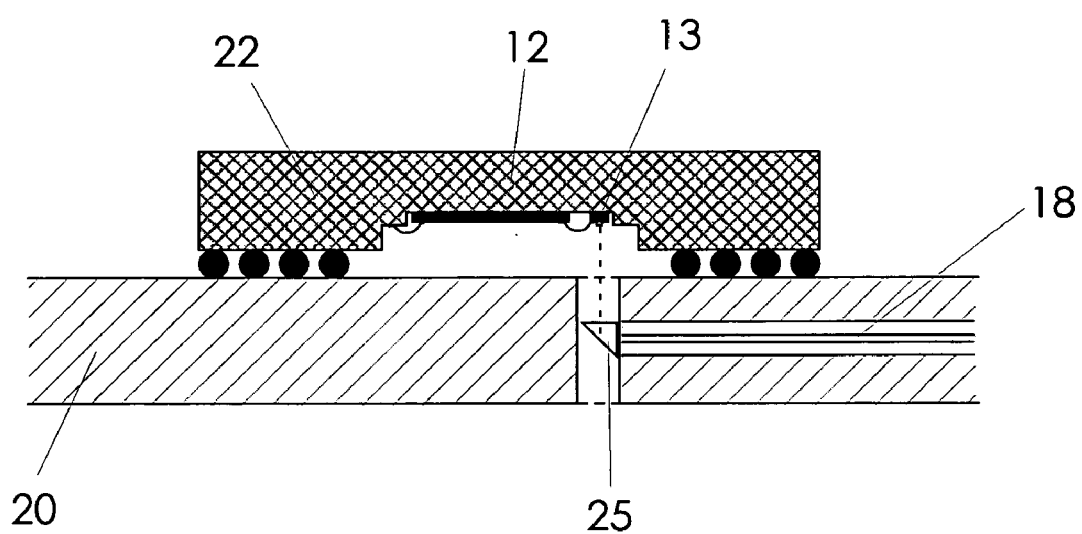
Figure 1C:
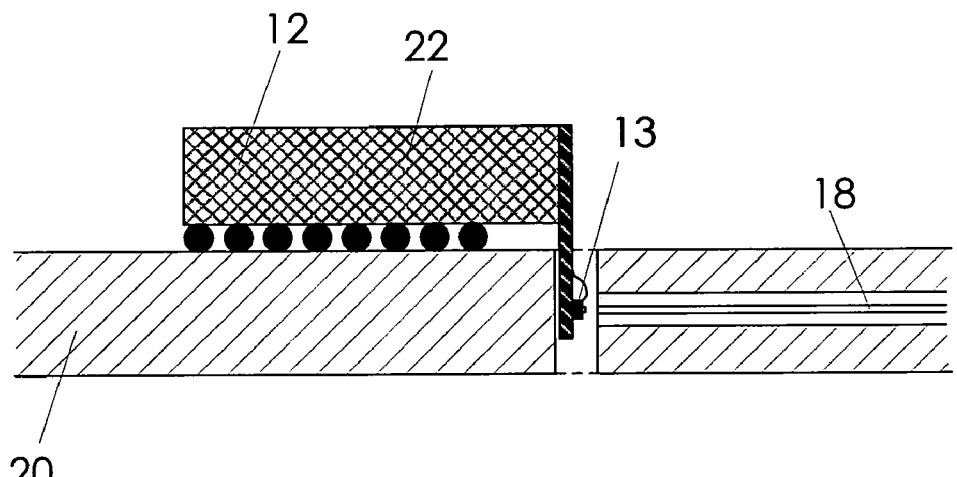
Figure 2A:
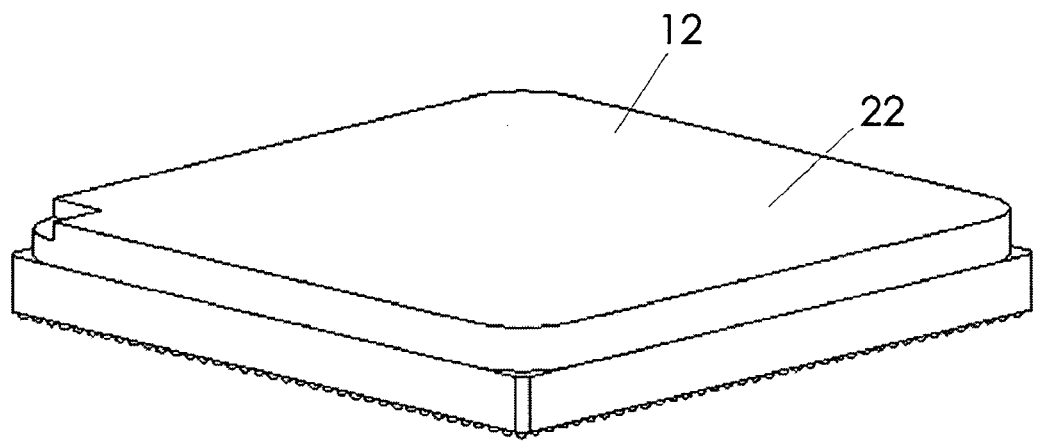
FIGS. 2a to 2d, are schematic perspective views of standard integrated circuits (IC) packages used in the electronics industry: a) represents a cavity down ball grid array (BGA), b) represents a cavity up pin grid array (PGA), c) represents a leadless Chip Carrier, and d) represents a Quad Flat Pack.
Figure 2B:
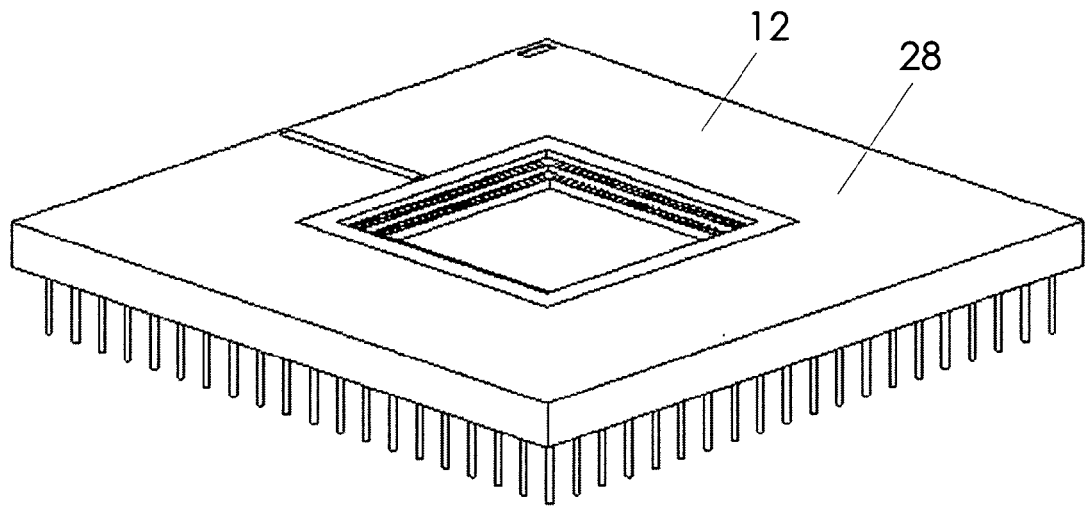
Figure 2C:
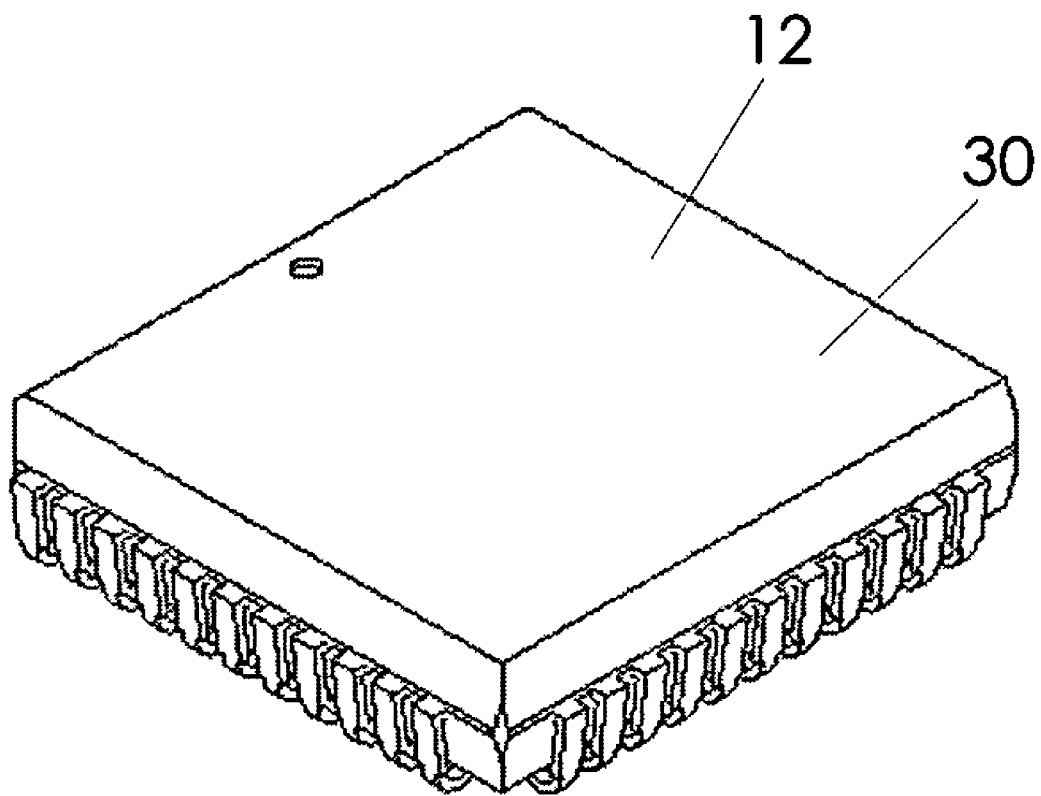
Figure 2D:
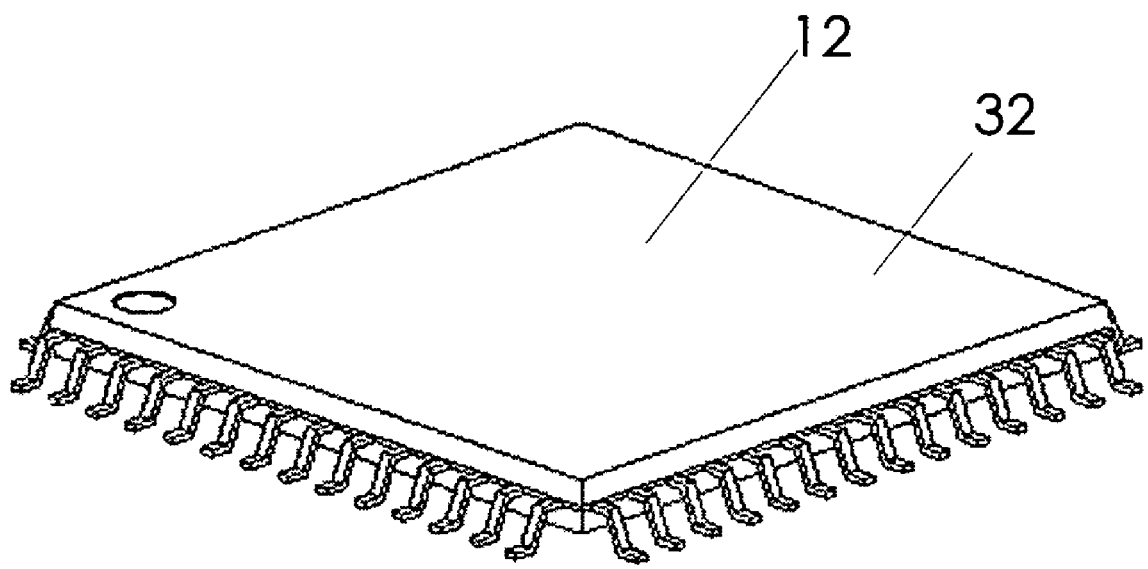

Integrated circuit (IC) packages 12 are standard mechanical/electrical housings to semiconductor chips. They are used to electrically connect the fragile semiconductor chip's electrical signals to a printed wiring board (PWB). IC packages 12 are connected via external connection pins to a printed wiring board (PWB) 20 by either press-fit or soldering techniques. There are many variations of IC packages 12 and printed wiring boards 20, each suited for some mechanical or electrical constraint. FIG. 2a to 2d, which are labeled prior art, are examples of standard IC packages 12 that are used in the electronics industry. FIG. 2a represents a cavity down ball grid array (BGA) 22, FIG. 2b illustrates a cavity up pin grid array (PGA) 28, FIG. 2c presents a leadless chip carrier 30, whereas FIG. 2d presents a quad flat pack (QPD) 32.

Optical Hybrid IC (OHIC) packages

In an embodiment of the present invention, an optical sub-assembly (OSA) is placed into an IC package 12. This provides an optical hybrid IC (OHIC) package that has been augmented to include both electrical (external connection pins) and optical input/outputs.

In one embodiment, IC packages 12 are modified to accept an optical sub-assembly (OSA) 14. This is illustrated in FIGS. 3a, 3b, 3c and 3d. A particular type of OSA 14 is described in the U.S. patent application Ser. No. 10/625,905 entitled "Optical Connector Assembly". The OSA 14 is a self-contained optical-to-electrical or electrical-to-optical converter module that has an electrical interface as well as an optical interface. The OSA 14 comprises an optoelectronic device such as, for example, a VCSEL 13, and comprises an optical light channel 41 that is optically coupled to the VCSEL 13 output on one end, and that defines, on the other end, an optical output facet 40 of the OSA 14, which serves as the OSA's optical interface with other waveguides. OSAs 14 are thus complete integrated assemblies that can be electrically connected to an IC package 12 and optically coupled, by means of their optical output facet 40, to any kind of optical waveguide.

In one embodiment of OSA 14, the optical light channel 41 is an optical ferrule 42, as described in the U.S. patent application Ser. No. 10/625,901. Such an optical ferrule 42 comprises one or several optical fibers, disposed in a body, one end of the optical fibers being part of a beveled surface 44 of the body whereas the other end of the fibers are part of a flat facet of the body. As described in the U.S. patent application Ser. No. 10/625,901, such an optical ferrule 42 is easily coupled to a VCSEL 13 to form a self-contained OSA 14.

Figure 3A:
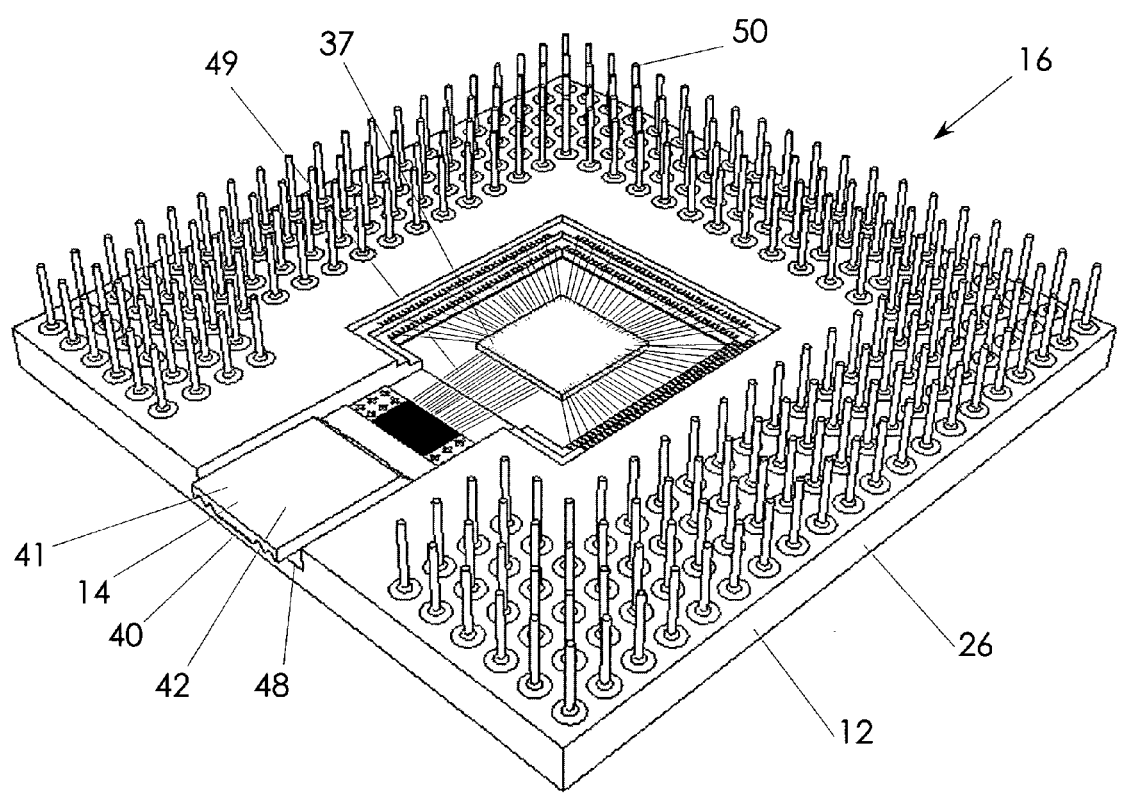
FIG. 3a is a schematic perspective view of an optical hybrid IC (OHIC) package made with a cavity down PGA with recessed interface and an optical subassembly (OSA) that was inserted into the cavity, in accordance with an embodiment of the present invention, the OSA having a flat end coupling exceeding the PGA package for external side-coupling.
Figure 3B:
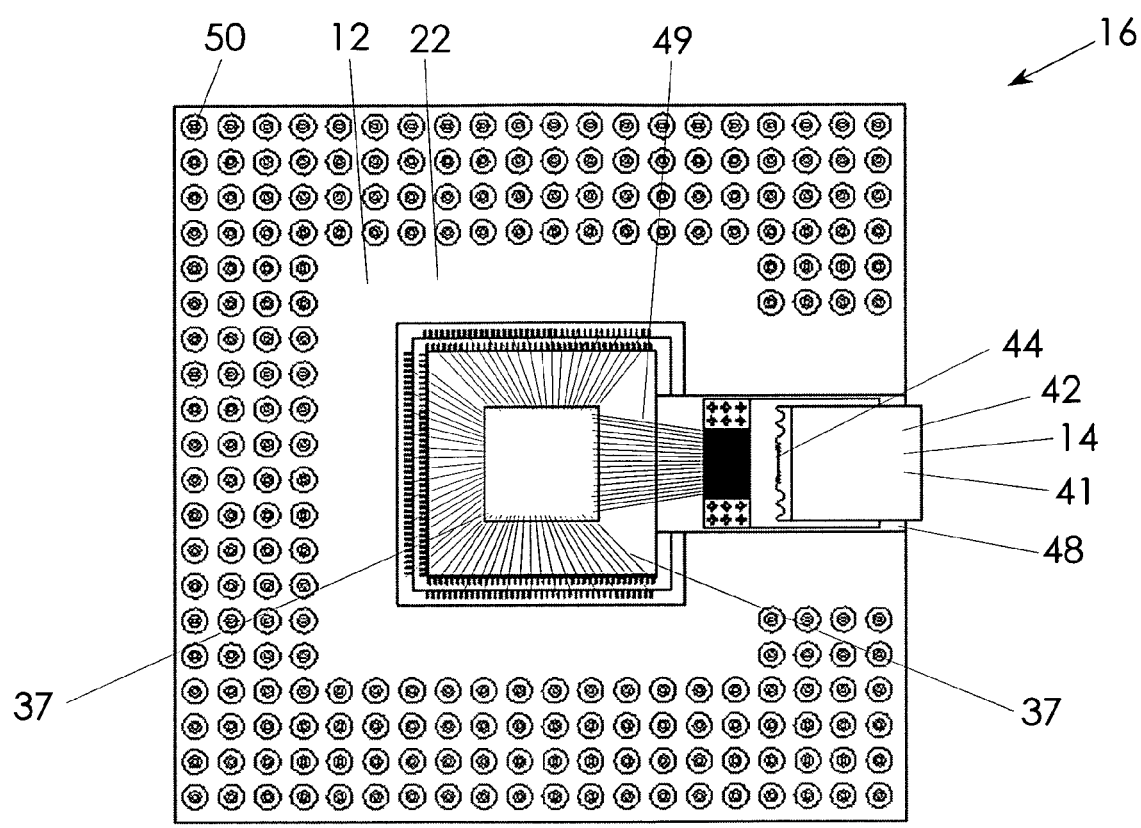
Figure 3C:
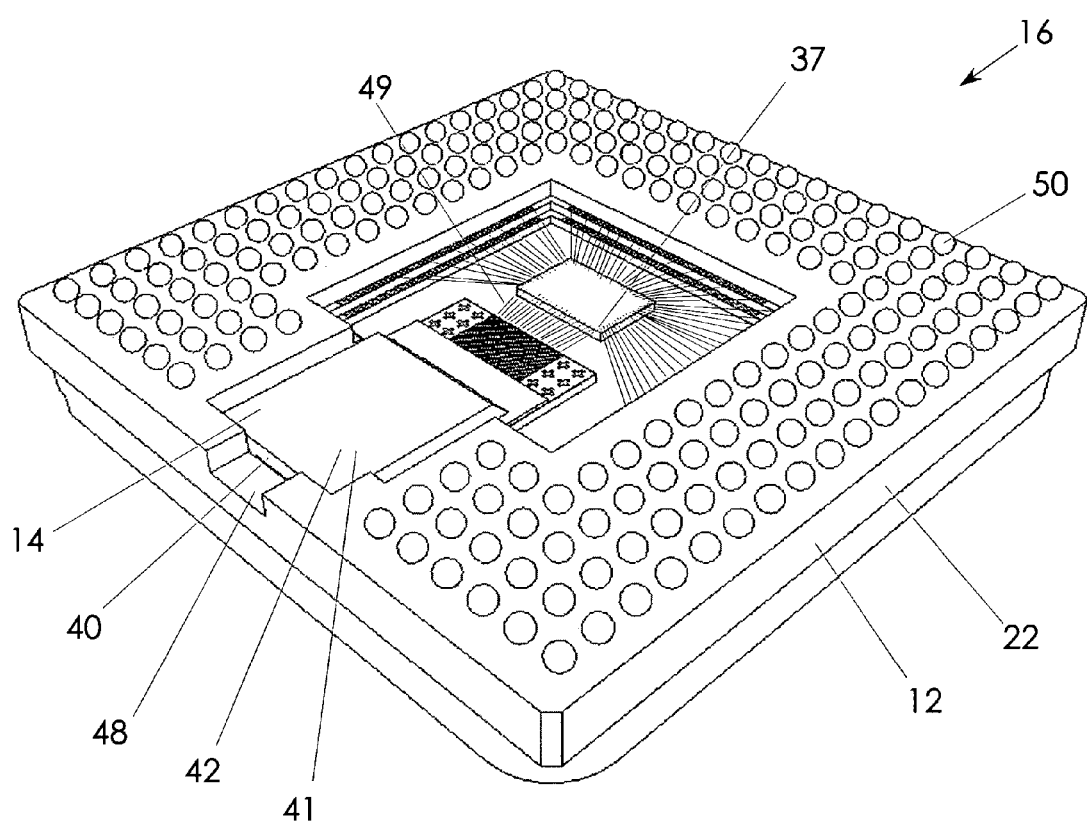
FIG. 3c is a schematic perspective view of an optical hybrid IC (OHIC) package made with a cavity down BGA with a recessed interface and an optical subassembly (OSA) that was inserted into the cavity, in accordance with an embodiment of the present invention, the OSA having a flat end coupling inside the BGA package for internal side-coupling.
Figure 3D:
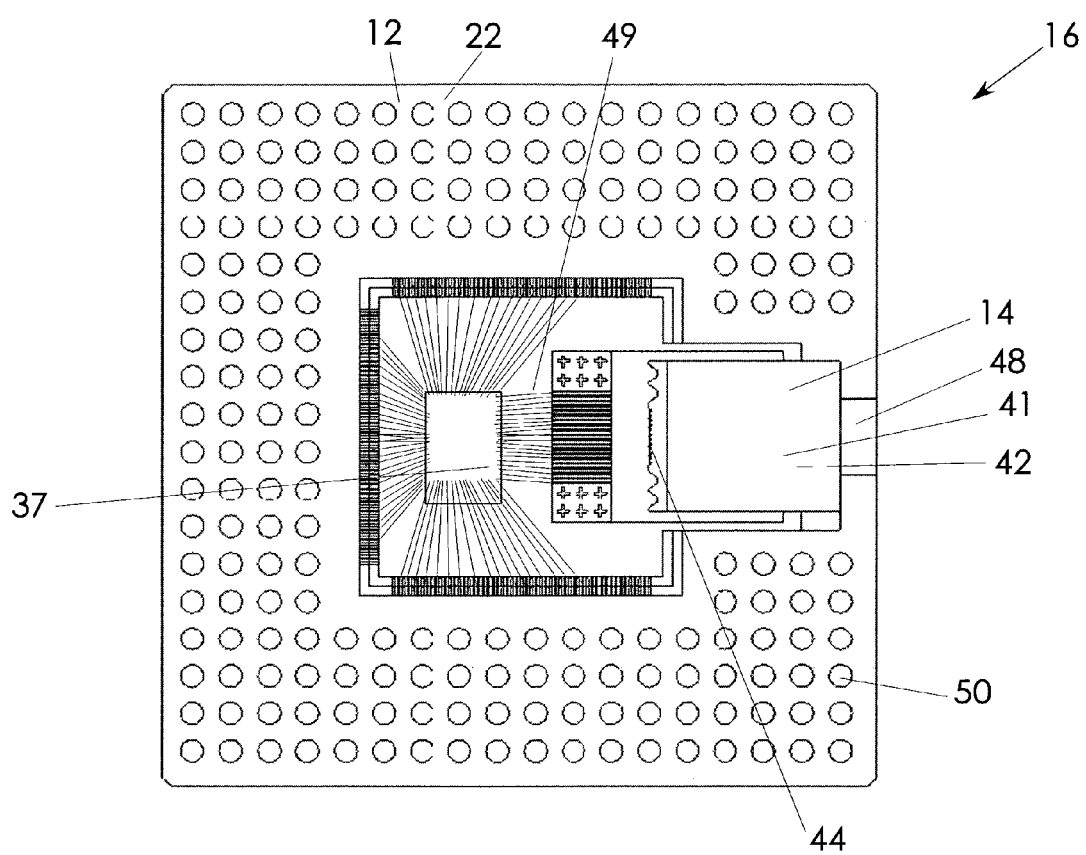
FIG. 3d is a schematic bottom view of the OHIC of FIG. 3c.

FIGS. 3a and 3b illustrate a possible way to modify an IC package 12, here a cavity down PGA 26, according to an embodiment of the present invention, to accept an optical sub-assembly (OSA) 14. The IC package 12 is modified to provide a recessed cavity interface 48, the recessed cavity interface 48 having dimensions such that the OSA 14 can sit in it and be wirebonded to the IC package 12 wirebond fingers 37. In this embodiment, the cavity down PGA 26 was slightly enlarged and the side of the package was opened to receive the OSA 14. Also in this embodiment, the output coupling facet 40 of the OSA 14 extends beyond the IC package 12 housing to provide an external optical coupling between the OHIC package 16 and the optical waveguide 18. In another embodiment illustrated in FIG. 3c and 3d, the output coupling facet 40 of the OSA 14 is recessed with respect to the IC package 12 housing to provide an internal optical coupling between the OHIC package 16 and the optical waveguide 18.

As someone skilled in the art will appreciate, the OSA 14 can also be installed in an unmodified IC package in order to form the OHIC package 16. Also, as someone skilled in the art will appreciate, more than one OSA 14 can be installed in the IC package 16 and thus OHIC package 16 may comprises several output coupling facets 40.

In one embodiment of the present invention, the OSA 14 is provided with alignment features. The placement of the OSA 14 within the IC package 12 is accomplished by having internal alignment features within the body of the IC package 12 that can easily mate to the alignment features of the OSA 14. This way, a control of the vertical, horizontal, and rotational positions of the OSA 14 relatively to the IC package 12 is provided. Thus, either the OSA is aligned within the IC package by way of precision pick-and-place methodologies or internal alignment features within the IC package allow the OSA to be self-aligned using in-situ mechanical references. The OSA 14 can then be electrically connected to the wirebond fingers 37 of the IC 12 package or possibly another microchip using wirebonds 49. The electrical connections using wirebonds 49 allow the optical interface of the OSA (optical output facet 40) to be well placed within the IC package 12: wirebond 49 lengths can be adjusted to take up small variations in the position of the OSA 14 within the recessed cavity 48 of the IC package 12.

Once the OSA 14 has been placed inside the recessed cavity 48 of the IC package 12 and has been wirebonded to the IC package 12, a new self-contained optical multi-chip module is formed, called an optical hybrid IC (OHIC) package 16. This OHIC package 16 can be later on easily connected to a PWB 20 both electrically, via the OHIC package's standard external connections 50, and optically, via the optical facet 40 provided by the OSA 14.

Figure 6:
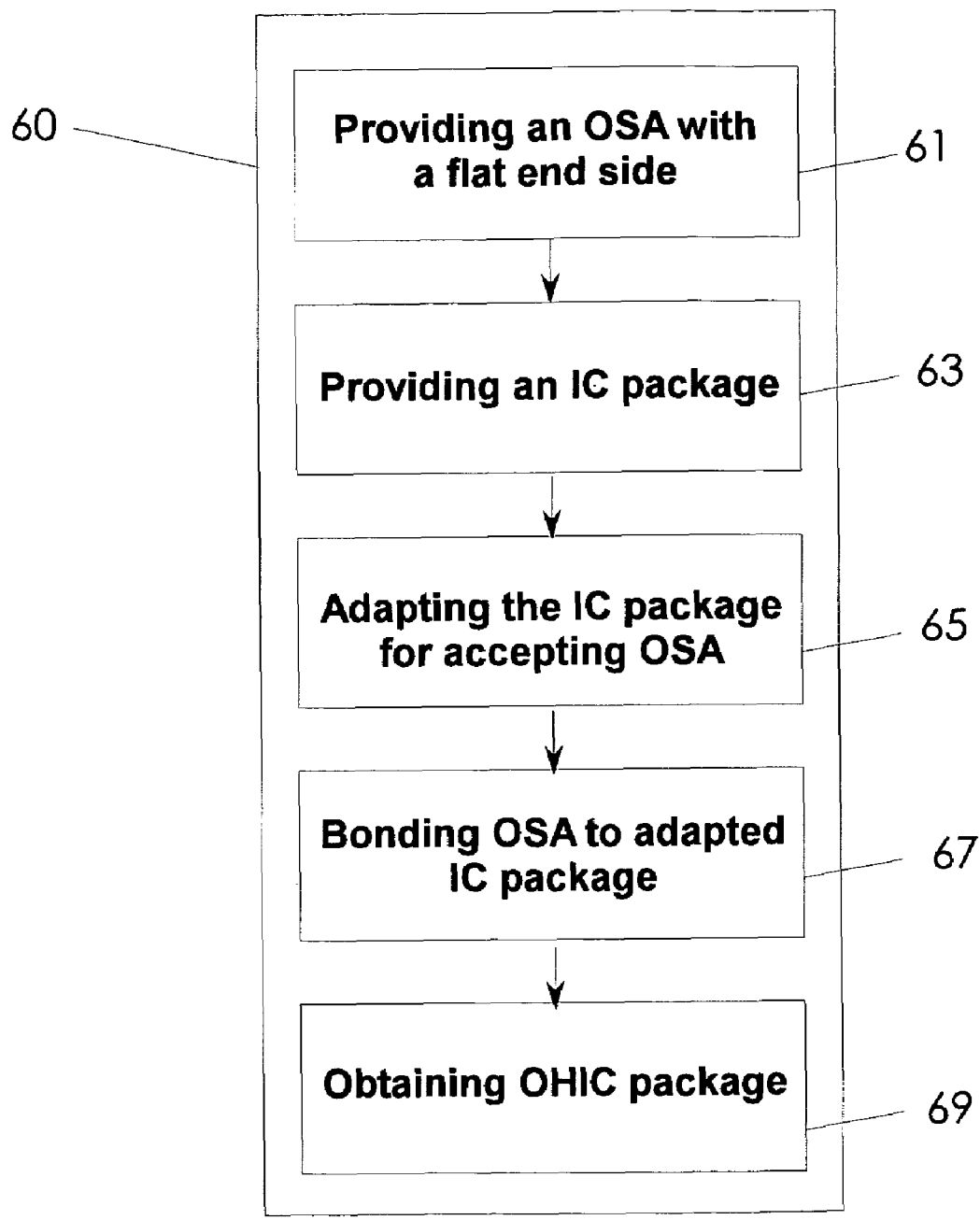
FIG. 6 is a flowchart of a method to provide an OHIC package, in accordance with an embodiment of the present invention.

The present invention therefore provides a method 60 for creating an OHIC package 16. As illustrated in FIG. 6, the method 60 comprises providing an OSA 14 (step 61), wherein the OSA 14 has characteristics that were mentioned earlier. Then the method 60 comprises providing an IC package 12 (step 63). Then the method 60 comprises adapting the IC package 12 for accepting the OSA 14 (step 65). Then the method 60 comprises electrically bonding the OSA 14 to the modified IC package 12 (step 67) in order to obtain the OHIC package 16.

According to an embodiment, the OHIC package 16 has, on one of its sides, an optical facet 40 that is used to couple light between an optical waveguide 18 of the PWB 20 and the optoelectronic device incorporated into the OHIC 16 package. Therefore, the present embodiment enables an eventual optical side-coupling of an IC package 12 to an optical waveguide 18.

In order to easily align the OHIC package 16 to an optical waveguide, OHIC package 16 is provided with external alignment features.

Thus the invention provides an OHIC package 16, which is a self-contained hybrid semiconductor package that has both electrical and optical inputs and outputs (I/O). The electrical I/Os are accessed through typical means such as pins, leads, or solder balls and the optical I/Os are accessed by way of a coupling out the side of the package (side-coupling) via its optical facet 40. Also, as mentioned earlier, the OHIC package 16 further has external alignment features for easy optical coupling to an optical waveguide.

Optically Enabled Printed Circuit Board (OE-PCB)

Figure 4A:
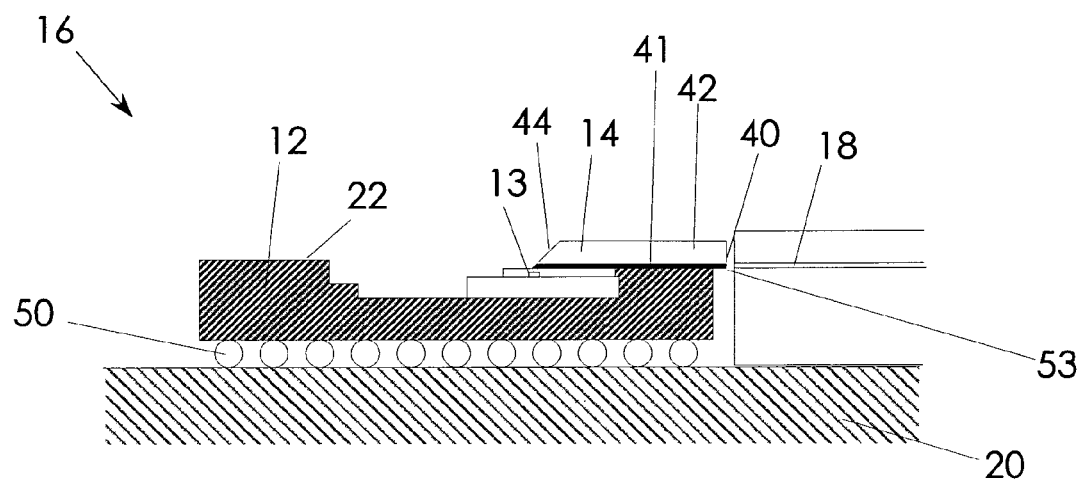
FIGS. 4a to 4e are schematic cross-sectional views of portions of an optically enabled printed circuit board (OE-PCB), in accordance with one embodiment of the present invention: a) presents an optical hybrid IC (OHIC) package, made with a cavity up BGA, that is side-coupled to an overlaid optical waveguide via a butt-coupled interface, b) presents an OHIC package, made with a cavity down BGA, that is side-coupled via a recessed interface, c) is an OHIC package, made with a cavity down PGA, that is side-coupled to an overlaid optical waveguide via a butt-coupled interface, d) presents an OHIC package, made with a cavity down BGA, that is side-coupled via a recessed interface (internal side-coupling), e) presents an OHIC package, made with a cavity down PGA with recessed side-coupling OSA coupled to an embedded optical waveguide (internal side-coupling)
Figure 4B:
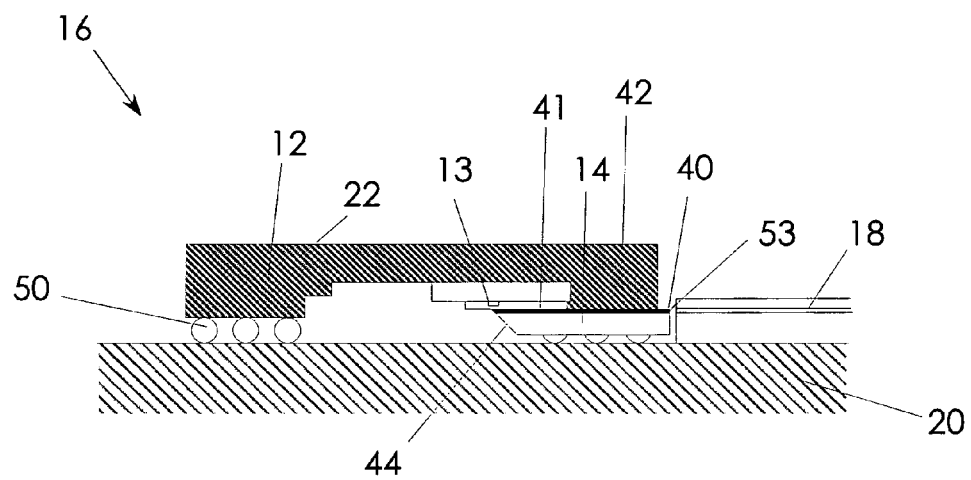
Figure 4C:
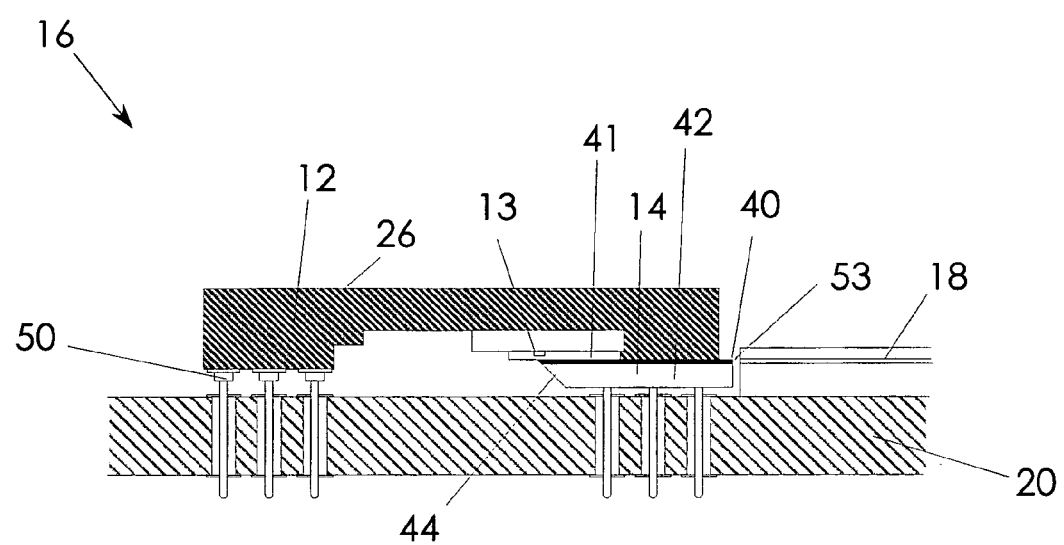
Figure 4D:
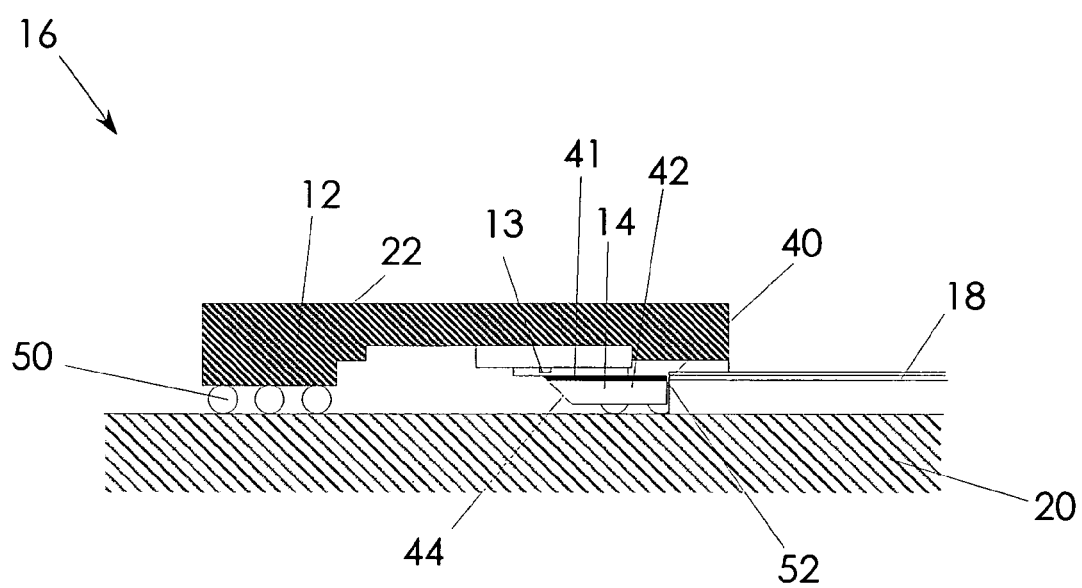
Figure 4E:
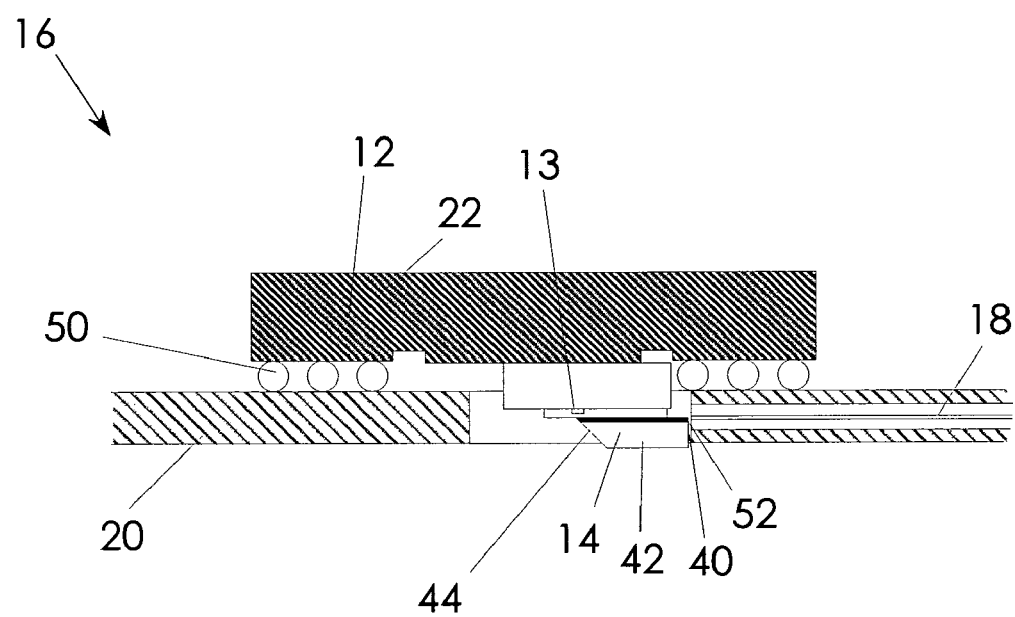

FIGS. 4a to 4e are examples of different embodiments of the invention, where an OHIC package 16 has been placed near an optical waveguide 18 that has been fixed to a PWB 20, to form a so-called optically enabled printed circuit board (OE-PCB). FIG. 4a illustrates an OHIC package 16 formed with a cavity up BGA 22 and an OSA 14. The optical output facet 40 is close to the end facet 21 of the optical waveguide 18 such that light between the OHIC package 16 and the waveguide 18 is coupled. The optical output facet 40 slightly extends beyond 53 the IC package 12 to provide for an OHIC-waveguide external side-coupling. FIG. 4b illustrates an OHIC package 16, made with a cavity down BGA 22, butt-coupled to an optical waveguide 18, in a similar manner than in FIG. 4a. FIG. 4c shows an OHIC package 16 made with a cavity down PGA 26, and butt-coupled to an optical waveguide 18, in a similar manner to FIG. 4a. FIG. 4d is an example of an OHIC package 16, this time made with a cavity down BGA 22, that has an optical output facet 40 that is a recessed output facet 52, enabling optical coupling with an optical waveguide 18 that is slightly inserted in the side of the OHIC package 16. FIG. 4e is an example of an OHIC package 16, made with a cavity down BGA, coupled with an embedded optical waveguide. All of these arrangements, and others similar and obvious to someone skilled in the art, are possible realizations of the so-called optically enabled printed circuit board (OE-PCB).

In some of the above embodiments, the optical waveguide 18 of the PWB 20 is a planar laminated optical waveguide. It will be obvious for someone skilled in the art that other optical waveguide types could also be used, all types of waveguides are thus included as possible embodiments of the present invention including the use of parallel ribbon optical fiber.

Figure 5A:
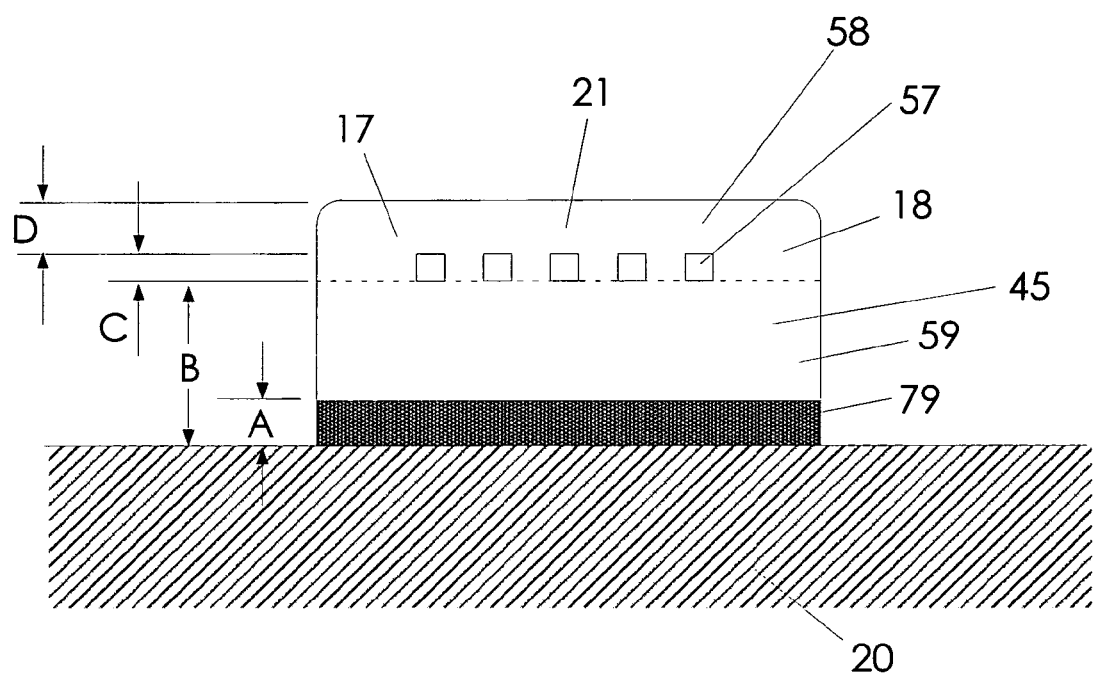
FIG. 5a is a cross-sectional view of a printed wiring board illustrating the end facet of a laminated planar optical waveguides assembly, in accordance with an embodiment of the present invention.
Figure 5B:
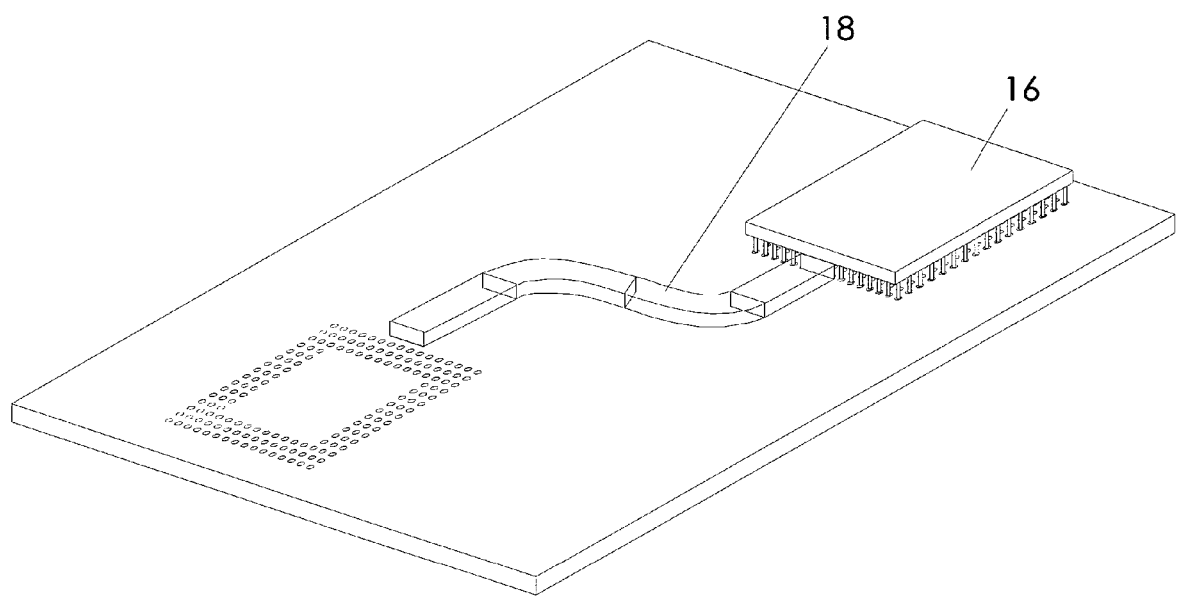
FIG. 5b is a perspective view of a laminated planar optical waveguide on a printed wiring board coupled to an OHIC package, in accordance with an embodiment of the present invention.

It is an objective of the present invention to impact as little as possible the standard methods used to build PWBs 20. To do so, a finished PWB 20 is augmented with an external optical layer as shown in FIGS. 5a and 5b to provide for a planar laminated optical waveguide 18 on the surface of the PWB. It should be obvious to one skilled in the art that an optical waveguide embedded in the layers of the PWB can also be used with the OHIC package 16 by lowering the optical coupling facet 40 plane as shown in FIG. 4e. However, given the objective to provide for non-modified PWBs, the external planar laminated optical waveguide's layering structure can be used to facilitate the vertical alignment between the optical coupling facet 40 of the OHIC package 16 and the cores 57 of the optical waveguides 18. FIG. 5a illustrates a end-facet 21 of a multi-core planar laminated optical waveguide assembly 17 comprising: 1) an adhesive/alignment layer 79 of thickness "A", 2) a buffer layer 59 of thickness "B minus A", 3) a core 57 layer of thickness "C", and 4) a surrounding and top cladding layer 58 of thickness "D".

In one embodiment of the present invention, a vertical alignment between the optical coupling facet 40 of the OHIC package 16 and the cores 57 of the optical waveguides 18 is provided by a vertical alignment layer 45, here the buffer layer 59, which allows to create optical waveguides 18 that have cores 57 at a quite precisely known vertical position with respect to a vertical reference of the PWB 20. The distributed thickness of the buffer layer 59 along the PWB 20 surface is such as to precisely follow the thickness variations of the adhesive/alignment layer 79 along the PWB 20 surface to regulate the vertical height "B" in FIG. 5a at a fixed distance between the cores 57 and the surface of the PWB 20. Methods known to someone skilled in the art can be used to create a buffer layer 59 that will result in a substantially precise core 57 vertical position with respect to a PWB 20 reference surface position.

In another embodiment of the present invention, the vertical alignment between the optical coupling facet 40 of the OHIC package 16 and the cores 57 of the optical waveguides 18 is provided by an alternate layer. This alternate layer is used as a vertical alignment reference with respect to which an OHIC 16 package can be easily coupled. For example, the cladding layer 58 can be the vertical alignment layer 45 and serve as a top surface reference to which the OHIC package 16 is aligned. In an embodiment, the OHIC package's external alignment features provide a vertical alignment by which a flat surface within the OHIC package can rest on the top surface of the cladding layer 58. The thickness "D" of the cladding layer 58 down to the cores can then be maintained even if the other thicknesses "A", "B", and "C" are not. Those are only some arrangements of a plurality of arrangements provided by the present invention.

The fully assembled OHIC package 16 is then integrated with the planar laminated optical waveguide of the PWB 20. The external alignment features within the body of the OHIC package 16 are used to align the OSA's optical facet 40 with the end-facet 21 of the optical waveguide 18. As a person skilled in the art will appreciate, the position and geometry of the optical waveguide 18 on the PWB 20 instead of the electrical I/O pins (or leads or solder balls) mostly determines the position of the OHIC package 16. Similar to wirebonding as described above, the "slack" provided by the standard electrical connections (such as pins in plated through-holes of a printed circuit board) can allow for small amounts of movement so that the OSA 14 enclosed in the OHIC package 16 and the optical waveguide interfaces can be aligned.

The main precision interface in this entire assembly is the one between the OSA 14 found in the OHIC package 16 and the optical waveguide 18. Given that the optical waveguide 18 is appropriately dimensioned and appropriately vertically positioned with respect to a PWB 20 surface reference (with the use of the vertical alignment buffer layer technique described above) and the OSA 14 is properly positioned inside the OHIC package, it is the OHIC package 16 that becomes the common reference and allows the two optical interfaces (i.e. the optical OHIC output facet 40 and the end facet 21 of the optical waveguides 18) to become aligned. Thus, the present invention takes advantage of the "slack" or "tolerance" provided by standard electrical connection methods known to one skilled in the art.

Figure 7:
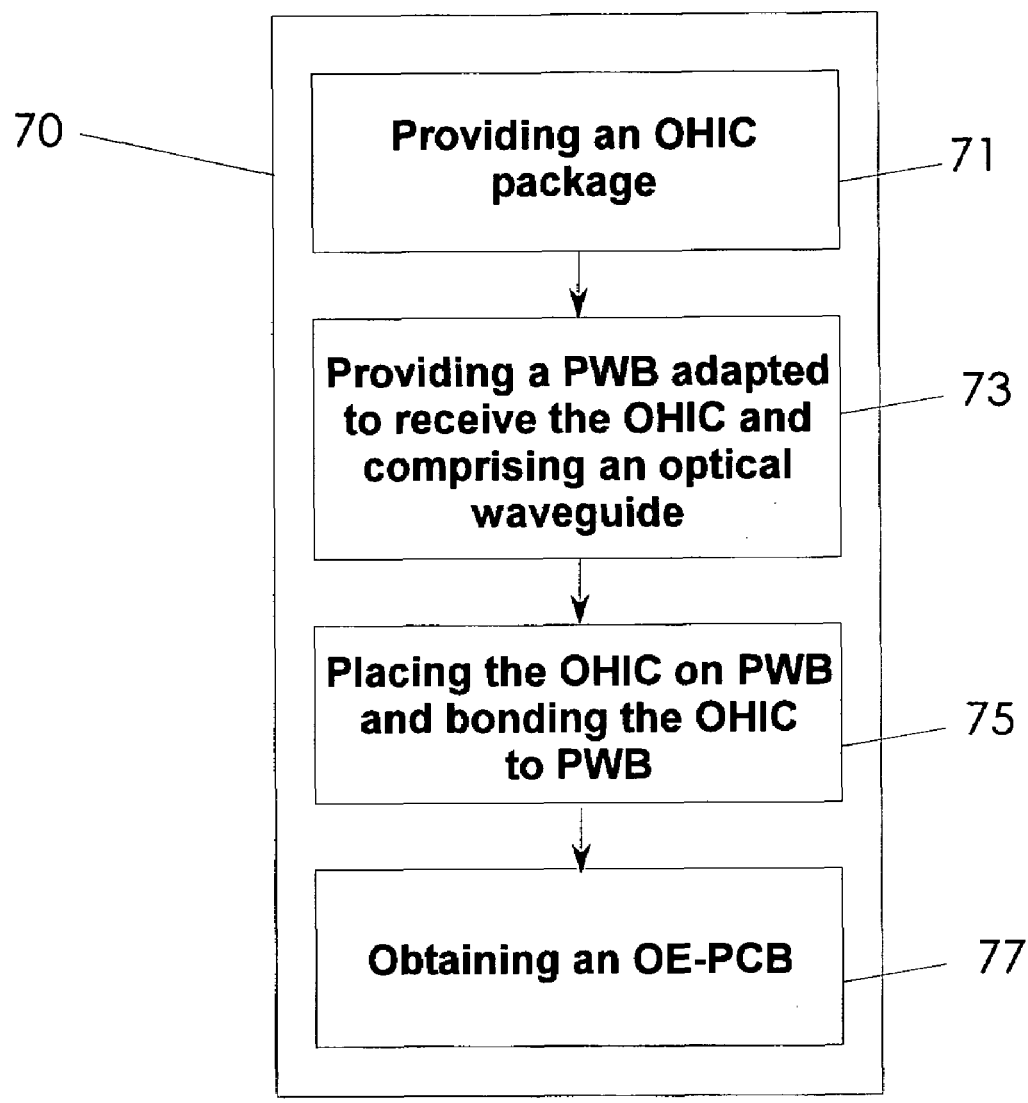
FIG. 7 is a flowchart of a method to provide an optical enabled printed circuit board, in accordance with an embodiment of the present invention Further details of the invention and its advantages will be apparent from the detailed description included below.

Turning now to FIG. 7, the method 70 to provide an optically enabled printed circuit board (OE-PCB) will be summarized. The method comprises providing an OHIC package 16 (step 71). The method 70 also comprises providing a PWB 20 adapted to receive the OHIC package 16 and comprising at least one optical waveguide 18 (step 73). The method 70 also comprises placing the OHIC package 16 on the PWB 20 and then bonding the OHIC package 16 to the PWB 20 (step 75). In step 77, an OE-PCB is obtained.

Although the present invention has been described hereinabove by way of specific embodiments thereof, it can be modified, without departing from the spirit and nature of the subject invention as defined herein. The scope of the invention is therefore intended to be limited solely by the scope of the appended claims.

We claim:

1. A self-contained optical hybrid IC (OHIC) package for optical side-coupling to an optical waveguide of a printed wiring board (PWB), the OHIC package comprising:
    an integrated circuit (IC) package;
    a self-contained optical subassembly (OSA) having an optical coupling facet and being adapted to be bonded to said integrated circuit (IC) package, wherein said OSA comprises an optoelectronic device and an optical channel, said optoelectronic device being optically coupled to said optical channel, said optical channel relaying light between the optoelectronic device and said optical coupling facet; and
    wherein said OSA is electrically bonded to said IC package to thereby provide an electrical coupling between the optoelectronic device and the IC package and enable said optical side-coupling to said optical waveguide via said optical coupling facet.

2. The OHIC package of claim 1, wherein the optical channel comprises:
    a body, in which at least one optical fiber is embedded along a flat side of the body, wherein the optical fiber has a portion of a cladding removed along the flat side and wherein the flat side is coupled to the optoelectronic device,
    the body having at one end a beveled surface at which one end of the optical fiber terminates and at which said light is reflected, and having, at an opposite end, said optical coupling facet at which another end of the optical fiber terminates,
    wherein said body relays, along said optical fiber, said light between said optical coupling facet and said flat side via said beveled surface.

3. The OHIC package of claim 2, wherein said optical coupling facet comprises a recessed optical facet with respect to a side of the IC package to provide an internal optical side-coupling.

4. The OHIC package of claim 2, wherein said IC package comprises a portion adapted to receive said OSA.

5. The OHIC package of claim 4, wherein said portion forms an opening in a side of said IC package.

6. The OHIC package of claim 4, wherein said portion comprises an enlarged cavity to receive said OSA.

7. The OHIC package of claim 4, wherein said portion comprises internal mechanical alignment features for providing a defined location of said OSA in said IC package.

8. The OHIC package of claim 4, wherein said portion comprises external mechanical alignment features to mechanically align the OHIC to the optical waveguide.

9. The OHIC package of claim 2, wherein the OSA comprises an assembly of distinct optoelectronic devices, each being optically coupled to a corresponding distinct optical fiber of said at least one optical fiber of said body.

10. The OHIC package of claim 2, wherein said optical waveguide comprises an optical waveguide embedded in the PWB.

11. The OHIC package of claim 2, wherein said IC package comprises at least one of a ball grid array (BGA), a pin grid array (PGA), a lead chip carrier, and a quad flat pack (QFD).

12. The OHIC package of claim 2, wherein said optoelectronic device comprises at least one of a photodetector and a semiconductor laser.

13. The OHIC package of claim 1, wherein said IC package comprises a portion adapted to receive said OSA.

14. The OHIC package of claim 13, wherein said portion forms an opening in a side of said IC package.

15. The OHIC package of claim 13, wherein said portion comprises an enlarged cavity to receive said OSA.

16. The OHIC package of claim 1, wherein said IC package comprises internal mechanical alignment features for providing a defined location of said OSA in said IC package.

17. The OHIC package of claim 1, wherein said IC package comprises external mechanical alignment features to mechanically align the OHIC to the optical waveguide.

18. A method of creating a self-contained optical hybrid IC (OHIC) package for optical side-coupling to an optical waveguide of a printed wiring board (PWB), the method comprising:
providing an integrated circuit (IC) package;
providing a self-contained optical subassembly (OSA) having a optical coupling facet and being adapted to be bonded to an integrated circuit (IC) package, wherein said OSA comprises an optoelectronic device to which is optically coupled an optical channel, said optical channel relaying light between the optoelectronic device and said optical coupling facet;
placing said OSA in said IC package; and
electrically bonding said OSA to said IC package to thereby provide an electrical coupling between the optoelectronic device and the IC package and enable said side-coupling to said optical waveguide via said optical coupling facet.

19. The method of claim 18, wherein providing said OSA comprises:
embedding at least one optical fiber in a body along a side of the body to form a channel assembly;
at a first end of said channel assembly, removing a portion of the channel assembly to provide a beveled surface on a corresponding first end of said at least one optical fiber at which light is reflected;
at a second end of said channel assembly, removing a portion of the channel assembly to provide said optical coupling facet in which terminates a second end of said at least one optical fiber;
at a portion of said side of said channel assembly near said first end, creating an optical surface to provide a flat coupling side; and
placing said channel assembly such as the flat coupling side is facing said optoelectronic device and bonding the channel assembly to the optoelectronic device.

20. The method of claim 19, wherein providing said OSA further comprises encapsulating an optoelectronic device in a sealed body having a window, wherein said optoelectronic device is coupled to said optical channel through said window, said window facing said flat coupling side.

21. The method of claim 19, wherein providing the IC package comprises forming an opening in a side of said IC package to receive the OSA.

22. The method of claim 19, wherein providing the IC package comprises enlarging a cavity of said IC package to receive the OSA.

23. The method of claim 19, wherein providing the IC package comprises providing an IC package having internal mechanical alignment features for defining a location of the OSA in the IC package.

24. The method of claim 19, wherein providing the IC package comprises providing an IC package having external mechanical alignment features for mechanically align the OHIC to the optical waveguide.

25. The method of claim 18, further comprising creating an optically enabled printed circuit board (OE-PCB) for said optical side-coupling of the OHIC package to the optical waveguide, by:
providing a portion of a printed wiring board (PWB) adapted to accept said OHIC package, wherein the portion of the PWB comprises said optical waveguide;
placing the OHIC package on the portion of the PWB with the optical coupling facet facing an end facet of the optical waveguide; and
bonding the placed OHIC package to the portion of the PWB for achieving said optical side-coupling and thereby creating said OE-PCB.

26. The method of claim 25, wherein said providing a portion of a PWB comprises providing said optical waveguide with a controlled core location with respect to a reference by means of a vertical alignment layer provided in said optical waveguide between said core and said reference.

27. The method of claim 25, comprising using, when bonding said placed OHIC package, a range of relative positions between said optical coupling facet and end facet being provided by an electrical connection of said OHIC package.

28. The method of claim 19, further comprising creating an optically enabled printed circuit board (OE-PCB) for said optical side-coupling of the OHIC package to the optical waveguide, by:
providing a portion of a printed wiring board (PWB) adapted to accept said OHIC package, wherein the portion of the PWB comprises said optical waveguide;
placing the OHIC package on the portion of the PWB with the optical coupling facet facing an end facet of the optical waveguide; and
bonding the placed OHIC package to the portion of the PWB for achieving said optical side-coupling and thereby creating said OE-PCB.

29. The method of claim 28, wherein said providing a portion of a PWB comprises providing said optical waveguide with a controlled core location with respect to a reference by means of a vertical alignment layer provided in said optical waveguide between said core and said reference.

30. The method of claim 28, comprising using, when bonding said placed OHIC package, a range of relative positions between said optical coupling facet and end facet, said range being provided by an electrical connection of said OHIC package.

31. An optically enabled printed circuit board (OE-PCB) for optical side-coupling of an integrated circuit (IC) package to an optical waveguide, wherein said IC package incorporates an optoelectronic device, the OE-PCB comprising:

a self-contained optical hybrid IC (OHIC) package having an optical coupling facet and being adapted to be mounted to a printed wiring board (PWB), wherein said self-contained OHIC package comprises the IC package and an optical channel for relaying light between the optoelectronic device and said optical coupling facet, to thereby enable said optical side coupling; and a printed wiring board (PWB), adapted to accept said OHIC package, wherein the PWB comprises said optical waveguide having an end;

wherein said OHIC package is placed on the PWB and bonded to the PWB such that the optical coupling facet of the OHIC package faces said end of the optical waveguide for achieving said optical side-coupling and thereby creating said OE-PCB.

32. The OE-PCB of claim 31, wherein the optical channel of said OHIC comprises:

a body, in which at least one optical fiber is embedded along a flat side of the body, wherein the optical fiber has a portion of a cladding removed along the flat side and wherein the flat side is coupled to the optoelectronic device, the body having at one end a beveled surface at which one end of the optical fiber terminates and at which said light is reflected, and having, at an opposite end, said optical coupling facet at which another end of the optical fiber terminates, wherein said body relays, along said optical fiber, said light between said optical coupling facet and said flat side via said beveled surface.

33. The OE-PCB of claim 32, wherein said optical coupling facet comprises a recessed optical facet with respect to a side of the IC package to provide an internal optical side-coupling.

34. The OE-PCB of claim 32, wherein said IC package comprises a portion adapted to receive said OSA.

35. The OE-PCB of claim 34, wherein said portion forms an opening in a side of said IC package.

36. The OE-PCB of claim 34, wherein said portion comprises an enlarged cavity to receive said OSA.

37. The OE-PCB of claim 34, wherein said portion comprises internal mechanical alignment features for providing a defined location of said OSA in said IC package.

38. The OE-PCB of claim 34, wherein said portion comprises external mechanical alignment features to mechanically align the OHIC to the optical waveguide.

39. The OE-PCB of claim 32, wherein the OSA comprises an assembly of distinct optoelectronic devices each being optically coupled to a corresponding distinct optical fiber of said at least one optical fiber of said body.

40. The OE-PCB of claim 32, wherein said optical waveguide comprises an optical waveguide embedded in the PWB.

41. The OE-PCB of claim 32, wherein said IC package comprises at least one of a ball grid array (BGA), a pin grid array (PGA), a lead chip carrier, and a quad flat pack (QFD).

42. The OE-PCB of claim 32, wherein said optoelectronic device comprises at least one of a photodetector and a semiconductor laser.

43. The OE-PCB of claim 31, wherein said optical waveguide comprises a buffer layer between a core of said optical waveguide and a reference for controlling a location of said core with respect to said reference.

44. The OE-PCB of claim 43, wherein said buffer layer is located between a surface of the PWB and said core and wherein said reference is said surface of the PWB.

* * * * *